May 26, 1970 HAN YING KU 3,514,348

METHOD FOR MAKING SEMICONDUCTOR DEVICES

Filed May 10, 1967 2 Sheets-Sheet 1

INVENTOR
HAN YING KU

BY Louis A. Kline
John J. Callahan

HIS ATTORNEYS

METHOD FOR MAKING SEMICONDUCTOR DEVICES

Filed May 10, 1967 2 Sheets-Sheet 2

INVENTOR
HAN YING KU

Louis A Kline

BY John J. Callahan

HIS ATTORNEYS

United States Patent Office 3,514,348
Patented May 26, 1970

3,514,348

METHOD FOR MAKING SEMICONDUCTOR DEVICES

Han Ying Ku, Dayton, Ohio, assignor to The National Cash Register Company, Dayton, Ohio, a corporation of Maryland Filed May 10, 1967, Ser. No. 637,509
Int. Cl. H01l 7/00
U.S. Cl. 148—188 11 Claims

ABSTRACT OF THE DISCLOSURE

This invention provides a method of depositing a silicon dioxide layer upon heated or unheated semiconductor material, which layer may be doped to provide a source for diffusion of impurity atoms into a semiconductor, or as a mask when the silicon dioxide is undoped, the mask to be used in semiconductor diffusion from gas systems. This method provides depositing of colloidal silicon dioxide particles which are suspended in a liquid, the combination forming a liquid dispersion, onto semiconductor material, and then drying the semiconductor. The liquid dispersion can be painted, dipped, sprayed, or brushed onto the selective semiconductor surface and dried to form a silicon dioxide mask. Solid or liquid doping materials can be dissolved in the liquid dispersion, the dispersion placed upon the semiconductor material, and the liquid dried, to form a doped silicon dioxide layer. The semiconductor material can thereafter be internally doped by diffusion of dopant atoms from the doped silicon dioxide layer into the semiconductor region covered by the layer by merely heating the semiconductor material.

BACKGROUND OF THE INVENTION

This invention relates to the deposition of a solid silicon dioxide layer upon semiconductor material at room temperature. A liquid dispersion containing colloidal silicon dioxide particles suspended in the solution, and either doped with a selected material dissolved in the liquid or not, depending on the application, is painted, sprayed, brushed, or dipped onto the semiconductor material. The semiconductor material is then dried to remove the liquid to form a solid semiconductor layer, which layer is either doped or undoped, depending on the application.

The advantage of this method over vapor phase diffusion is that a uniform distribution of dopant atoms can be controllably placed into a semiconductor wafer and a known concentration of dopant atoms can be placed into the semiconductor wafer, whereas, in the gas phase diffusion, gas flow over the layer causes uneven distribution of the dopant atoms and an uncontrolled concentration of dopant atoms into the semiconductor wafer.

One method for forming a mask on a semiconductor wafer comprises placing the semiconductor material in an oxidizing atmosphere of oxygen or steam. This method is described in U.S. Pat. No. 2,802,760, issued Aug. 13, 1957, on the application of Lincoln Derick and Carl J. Frosch. This method is not suitable for semiconductors such as germanium or gallium arsenide, for both germanium and gallium arsenide are unstable and sublime when they are oxidized, and therefore such oxides may not be used as diffusion masks.

Another method of forming a diffusion mask comprises the anodic oxidation of a semiconductor wafer in an aqueous solution. This method is described in U.S. Pat. No. 2,875,384, issued Feb. 24, 1959, on the application of John T. Wallmark. However, the anodized oxide layer of U.S. Pat. No. 2,875,384 appears to be rather thin for diffusion masking.

Another method of coating a silicon dioxide mask on a semiconductor wafer is by heating the semiconductor wafer in a vapor of organic siloxane compound, at a temperature below the melting point of the semiconductor but at a temperature above that at which the siloxane decomposes, to form a silicon dioxide mask. This method is described in U.S. Pat. No. 3,089,793, which issued May 14, 1963, on the application of Eugene L. Jordan and Daniel J. Donahue. However, the mask of Pat. No. 3,089,793 appears to vary in thickness, due to the flow of gas siloxane over the wafer. This method also requires a temperature which may injure certain types of semiconductors.

A fourth method of forming a mask on a semiconductor material is by the thermal decomposition of silicon tetrachloride in the presence of hydrogen and carbon dioxide on the semiconductor surface, which is heated to a temperature between 1,100 degrees centigrade and 1,200 degrees centigrade. This process is described in a paper by W. Steinmaier and J. Bloem, entitled "Successive Growth of Si and $SiO_2$ in Epitaxial Apparatus," J. Electrochem. Soc., vol. 111, pp. 206–209, 1964. This high-temperature technique for forming a mask is not suitable for semiconductors, such as germanium arsenide and gallium arsenide, which have melting points below 1,100 degrees centigrade.

One method of forming a doped layer on a semiconductor wafer comprises the simultaneous pyrolysis of siloxane and a doping impurity. This method is described in U.S. Pat. No. 3,200,019, which issued Aug. 10, 1965, on the application of Joseph H. Scott, Jr., and John Olmstead. However, the doping compounds for semiconductor materials disclosed in U.S. Pat. No. 3,200,019 appear to have higher vapor pressures than the siloxanes, so that the concentration of the dopant within the siloxane dopant mixture may change.

Another method of depositing a doped layer upon a semiconductor wafer comprises passing a gaseous mixture of silicon tetrachloride, carbon dioxide, hydrogen, and a dopant gas over a semiconductor wafer, which wafer is heated to a temperature of 1,200 degrees centigrade, the wafer being in the tube furnace. This method is described in NASA Technical Brief 65–10300, October 1965. However, this method requires the heating of the semiconductor material to 1,200 degrees centigrade. A 1,200-degree-centigrade temperature causes gallium arsenide to change electrical properties, due to the evaporation of arsenic from the gallium arsenide crystal. Germanium also melts at 1,200 degrees centigrade, so that this method is not feasible for germanium. Also, the doping impurity concentration in the oxide layer is subject to variations due to gas flow.

However, the present method uses silicon dioxide rather than a polymerizable organo-boron compound, and there is no polymerization in the present method.

Alan L. Harrington discloses, in U.S. Pat. No. 3,084,-079, issued Apr. 2, 1963, a method of coating a semiconductor material with a polymerizable organo-boron compound, polymerizing the compound on the semiconductor material, then heating the body to decompose the organo-boron compound to cause diffusion of boron into the semiconductor material to dope the semiconductor material with boron.

SUMMARY

This invention relates to a method of doping semiconductor material by depositing a doped liquid dispersion comprising colloidal silicon dioxide particles suspended in the liquid and a semiconductor dopant, the dopant being dissolved in said liquid, onto a selective area of a semiconductor material, the selective area overlying a region of the semiconductor which region has been selected for doping, drying the deposition so that the liquid of the dispersion evaporates and the dopant and the silicon dioxide solidify on the selected area to form a continuous silicon dioxide doped layer, and heating the region to a temperature sufficient to allow the dopant atoms of the layer to diffuse into the region to thereby dope the region. The invention also relates to placing the liquid dispersion, which does not contain dopant, onto a semiconductor and similarly drying the deposition to remove the liquid, thereby forming a mask upon the semiconductor material.

DESCRIPTION

Figure 1A:
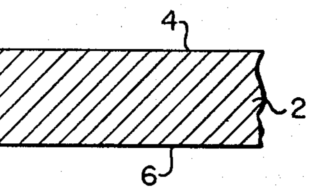
FIGS. 1*a* through 1*i* are cross-sectional views of the steps in the formation of an n-p-n transistor, using the method of this invention.

The present method relates to the formation of a silicon dioxide layer upon semiconductor material at room temperature by the application of a liquid dispersion, in which the dispersed phase is colloidal silicon dioxide particles, onto semiconductor material and drying the semiconductor material to remove the liquid from the dispersion, thereby depositing the colloidal particles on the material in the form of a solid silicon dioxide continuous layer.

Alternatively, a suitable dopant compound, which will dissolve in the liquid of the dispersion, is placed in the liquid dispersion. The doped liquid dispersion is then placed on the semiconductor material, and the deposition is dried to form a solid doped silicon dioxide layer. This layer can be used to supply dopant to be diffused into the semiconductor material at high temperatures. This method of depositing a dopant into the liquid dispersion allows one to determine a pre-specified amount and kind of impurity content which will be present in the doped silicon dioxide layer. This predetermination is not possible in a gas phase system, as the gas flow rate is too difficult to control to allow specified quantity supply and concentrations of dopant atoms to be lodged in the silicon dioxide layer.

This method can also use solid or liquid dopants, which are in large variety, whereas the gas phase method requires gas dopants which are few in number compared to available solid or liquid dopants. The only requirement for use of the solid or liquid dopants is that they be soluble in the liquid dispersion.

Since the present method requires no heating to deposit a silicon dioxide layer upon a semiconductor material, any semiconductor material which is a solid when unheated may be masked or doped by either a silicon dioxide mask or a doped silicon dioxide layer, respectively, by using the method of the present invention. Examples of such semiconductor materials are silicon, germanium, and silicon-germanium alloy, with the suitable dopant atoms for these semiconductors chosen from compounds which contain boron atoms, phosphorus atoms, aluminum atoms, gallium atoms, indium atoms, arsenic atoms, or antimony atoms. Other examples of semiconductors which may be prepared by use of either a doped silicon dioxide layer or an undoped silicon dioxide mask are gallium arsenide, gallium phosphide, gallium antimonide, indium phosphide, indium arsenide, and indium antimonide. Suitable dopant atoms for these compound semiconductors are zinc atoms, cadmium atoms, mercury atoms, silicon atoms, germanium atoms, tin atoms, lead atoms, sulfur atoms, selenium atoms, tellurium atoms, or polonium atoms.

The first embodiment describes the creation of a boron-doped silicon dioxide layer with a concentration of $3.3\times10^{20}$ boron atoms/cm.$^3$ of silicon-dioxide-doped material, to be used in the doping of a thin n-type silicon wafer to form a p region in the n-type silicon wafer. 2.8 grams of $H_3BO_3$ is dissolved in 500 milliliters of $H_2O$, which mixture is designated solution A. 20 milliliters of solution A is dissolved in 20 milliliters of 30% by weight colloidal silicon dioxide aqueous liquid dispersion, which liquid dispersion is available from many suppliers. To this 40-milliliter mixture is added 160 milliliters of $H_2O$.

The silicon wafer surface to be prepared is lapped and chemically polished by the use of conventional means, and then the prepared surface is made hydrophilic either by soaking the wafer in nitric acid to form a very thin oxide over the silicon wafer, or by the use of a wetting agent.

The prepared silicon wafer is centered on a spinner and spun to approximately 2,500 r.p.m. to provide for an even coating of the liquid dispersion. Next, during the spinning, a drop of the doped liquid dispersion is placed centrally on the spinning wafer with a dropper. An even liquid coating is thereby formed on the silicon wafer. This coating is allowed to be spun for a few minutes to dry. Next, a second drop is placed on the resultant silicon dioxide layer which is on the silicon wafer and allowed to be spun dry. This process is repeated until eight drops have been placed on the silicon wafer to form a coat. The silicon wafer is thus coated with successive layers of boron-doped silicon dioxide, which layers are dried successively due to spinning in the air.

The wafer is then put, coated side up, into a furnace at 1,150 degrees centigrade, which furnace has a nitrogen atmosphere, and the wafer is heated for two hours to cause boron to diffuse into the silicon. After diffusion, the wafer is removed. The silicon dioxide layer can be lapped off or not, depending upon the application. This process forms a p layer of 1.7 microns over the n-type substrate. The "sheet-resistivity" of the diffused layer is 320 ohms per square.

The second embodiment describes the doping with boron of an n-type silicon semiconductor wafer. To form a boron-doped silicon dioxide layer which has a concentration of $6.6\times10^{19}$ boron atoms/cm.$^3$ of doped silicon dioxide material, the silicon wafer surface is prepared by lapping the silicon wafer surface and chemically polishing the surface. The polished wafer can be made hydrophilic by then being soaked in nitric acid to form a very thin oxide over the silicon wafer. Alternatively, the surface of the wafer can be made hydrophilic by the use of a wetting agent. The silicon wafer is then placed on a spinner, as before described.

A doped liquid dispersion is made by first dissolving 2.8 grams of $H_3BO_3$ in 500 milliliters of $H_2O$, which mixture is termed solution A. To 10 milliliters of solution A is added 50 milliliters of 30 percent, by weight, colloidal silica liquid dispersion, which is commercially available. To this mixture is added 440 milliliters of $H_2O$ to form the doped liquid dispersion.

One drop of the doped liquid dispersion is placed on the spinning silicon wafer and allowed to spin-dry. Seven more drops are in series placed on the silicon wafer and allowed to dry until a doped silicon dioxide layer is formed on the silicon wafer. The doped silicon dioxide layer is densified—that is, water is removed from the layer—by baking the wafer for twenty minutes in a nitrogen atmosphere at 600 degrees centigrade. The wafer is then ready for diffusion.

The "dried" wafer is placed in a furnace at 1,150 degrees centigrade, which furnace has a nitrogen atmosphere, and heated for four hours and twenty minutes. A p region of 2.3 microns is thus formed in the n-type silicon wafer after the diffusion for four hours and twenty minutes has taken place. The "sheet-resistivity" of the diffused layer is 272 ohms per square.

In the third embodiment, a silicon dioxide mask is formed by mixing 20 milliliters of 30 percent, by weight, colloidal silica liquid dispersion with 180 milliliters of water. One drop of this liquid dispersion is placed on a semiconductor wafer, and the wafer is spun dry. This process is repeated for seven more drops. The silicon dioxide layer is then densified by being baked for twenty minutes in nitrogen at 600 degrees centigrade, which yields a silicon dioxide layer which can act as a mask against gas-phase diffusion.

In the fourth embodiment, a phosphorus-doped silicon dioxide layer is formed, the doping concentration of the layer being $9.4 \times 10^{20}$ phosphorus atoms/cm.$^3$ of silicon-dioxide-doped material. A p-type silicon wafer initially having a carrier concentration of $2 \times 10^{15}$ atoms/cm.$^3$ is used.

To form the doped silicon dioxide layer, 0.338 gram of $(NH_4)_2HPO_3$ is dissolved in 10 milliliters of 30 percent, by weight, colloidal silicon dioxide liquid dispersion, which liquid dispersion is available from many suppliers. Eight drops of the liquid dispersion are successively placed on the p-type silicon wafer, which has been made hydrophilic, as described in Embodiment Number One. The phosphorus-doped silicon dioxide layer is dried by the spinning of the wafer as the drops are applied.

The phosphorus doped silicon dioxide layer covered silicon wafer is placed for two hours in a furnace having a nitrogen atmosphere and a temperature of 1,150 degrees centigrade. An n-type region is formed in the p-type silicon wafer, the depth of the region being $1\mu$ and the surface carrier concentration of the region being $5 \times 10^{17}$ atoms/cm.$^3$ of doped silicon. The "sheet-resistivity" of the doped wafer is 900 ohms per square.

The wafer is then placed in a buffered hydrofluoric acid solution until the silicon dioxide layer is removed from the silicon wafer. Electrical leads are placed in contact with the p-type wafer and the n-type doped region to form a junction diode.

Figure 1B:
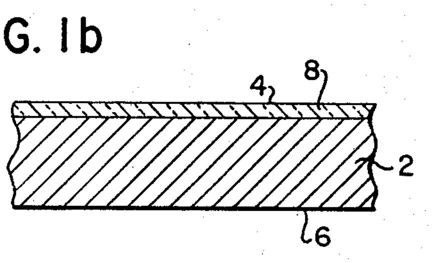

The use of this novel method to make an n-p-n transistor is now described. On side 4 of a 0.5 ohm/centimeter n-type silicon wafer 2, as shown in FIG. 1*a*, is placed a thin silicon dioxide mask 8, shown in FIG. 1*b*, described in Embodiment Number Three.

Figure 1C:
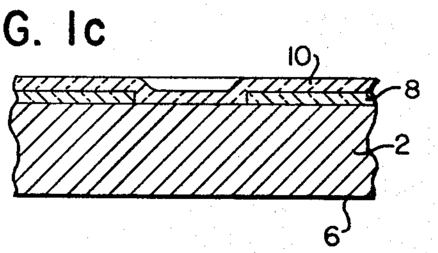
Figure 1D:
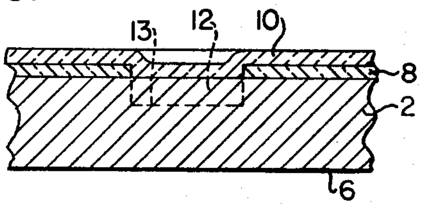
Figure 1E:
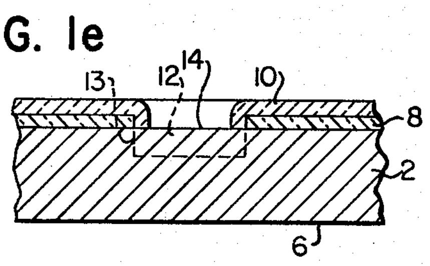

FIG. 1*c* shows the removal of a segment of the silicon dioxide mask, which is done by application of photoresist to the silicon dioxide mask 8, illumination of the photoresist covering parts of the silicon dioxide mask which are not to be etched, developing the photoresist, and then dipping the silicon wafer 2 in buffered hydrochloric acid.

A boron-doped silicon dioxide layer 10 is coated upon the silicon dioxide mask 8, so that the layer 10 comes into contact with the mask 8 and the silicon wafer 2. The silicon wafer is then placed for two hours in a furnace which is at 1,150 degrees centigrade. A p-region 12 of 1.7 microns depth with junction 13 is formed in the n-type silicon wafer 2 at a point where a portion of the mask 8 has been removed.

Figure 1F:
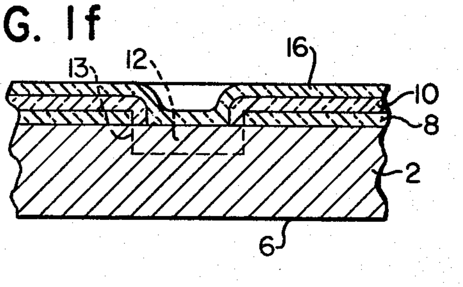
Figure 1G:
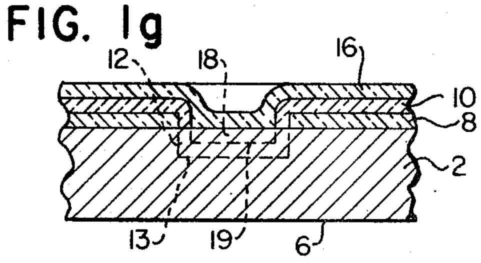
Figure 1H:
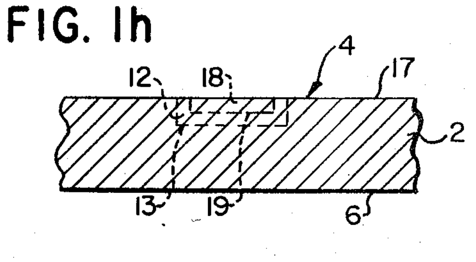
Figure 1I:
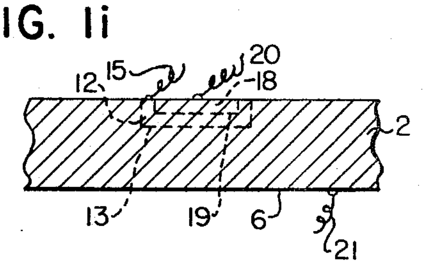

The silicon dioxide layer 10 is etched in buffered hydrofluoric acid to expose an area 14 of the wafer 2. A phosphorus-doped layer, as described in Embodiment Number Four, is deposited on side 4 of the wafer 2, including the area 14, as shown in FIG. 1*f*. The wafer is then placed for two hours in a furnace having a nitrogen atmosphere and a temperature of 1,150 degrees centigrade. Phosphorus diffuses into the boron-doped region 12 to form an n-region 18 of a depth of 1 micron with a junction 19. By dipping the wafer in concentrated hydrofluoric acid, the silicon dioxide layers are removed to expose an n-p-n junction transistor, as shown in FIG. 1*h*. Electrical leads are connected to the surfaces of the regions 12 and 18 and to the surface 6 to form an n-p-n transistor, as shown in FIG. 1*i*.

FIG. 2 shows another use of this novel invention. A p-type silicon wafer 22, having opposite sides 24 and 26, as shown in FIG. 2*a*, is coated with a thin silicon dioxide mask, 28, as described in Embodiment Number Three and shown in FIG. 2*b*. The silicon dioxide mask 28 is coated with a photoresist and selectively exposed to light, the photoresist is developed, and the layer 28 is etched in hydrogen fluoride to expose areas 30.

Figure 2A:
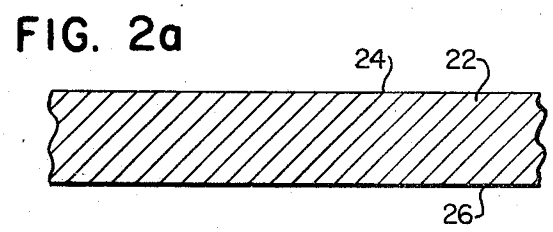
FIGS. 2*a* through 2*g* are cross-sectional views of the steps in the formation of a junction diode, using the method of this invention.
Figure 2B:
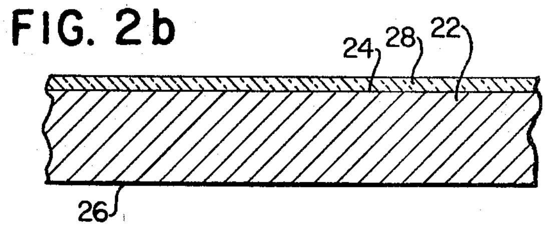
Figure 2C:
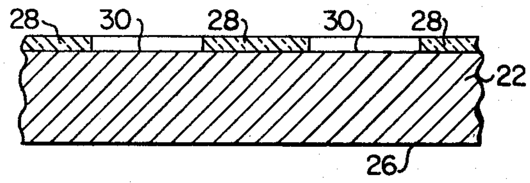
Figure 2D:
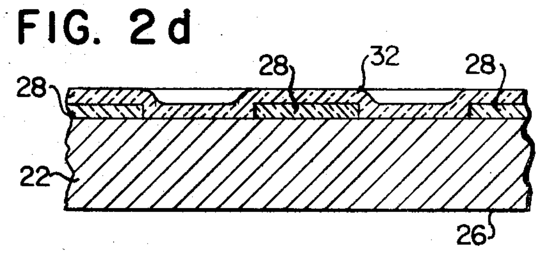
Figure 2E:
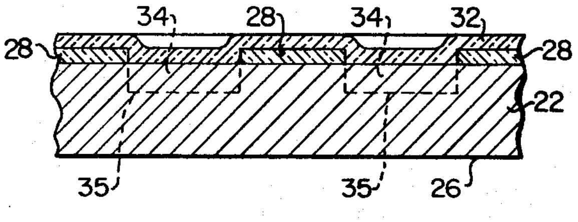

A phosphorus-doped silicon dioxide layer 32, whose preparation is described in Embodiment Number Four, is coated upon the surface of the mask 28 and the area 30, as shown in FIG. 2*d*. The wafer is placed in a furnace at 1,150 degrees centigrade for two hours to allow phosphorus atoms to diffuse. FIG. 2*e* shows a phosphorus-doped n-region 34 having a junction 35 in the p-type silicon wafer 22.

Figure 2F:
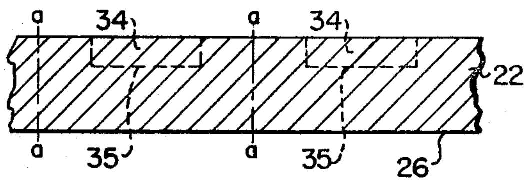
Figure 3A:
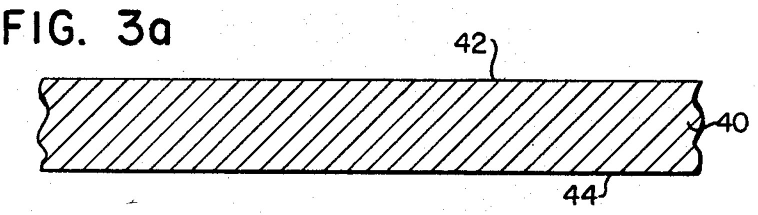
FIGS. 3*a* through 3*f* are also cross-sectional views of the steps in the formation of a junction diode, using the method of this invention.
Figure 2G:
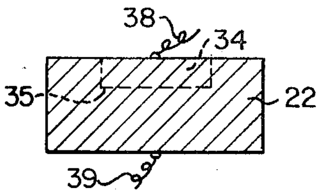

The wafer is dipped into hydrofluoric acid to remove the silicon dioxide layer 32 and the silicon dioxide mask 28. The wafer 22 is mechanically sliced in a direction along the lines *a—a*, as shown in FIG. 2*f*. An electrical lead 39 is attached to the side 26, and an electrical lead 38 is attached to the n-region 34, to form a junction diode, as shown in FIG. 2*g*.

FIG. 3 shows another novel use of the present invention to make a junction diode. An n-type silicon wafer 40 with opposite sides 42 and 44 is shown in FIG. 3*a*. A boron-doped silicon dioxide layer 46 is placed on the side 42 of the silicon wafer 40, as described in Embodiment Number Two, and as shown in FIG. 3*b*. Photoresist is placed on the boron-doped silicon dioxide layer 46. The photoresist is selectively exposed and developed, and the covered wafer 40 is placed in hydrofluoric acid to expose areas 50 on the side 42 of the wafer 40, as shown in FIG. 3*c*.

Figure 3B:
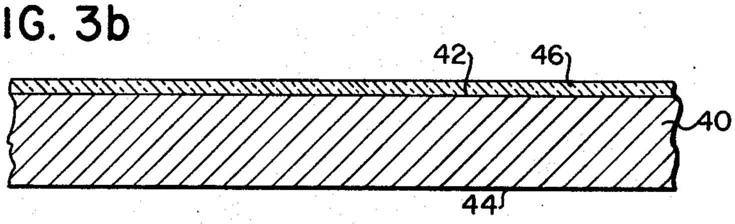
Figure 3C:
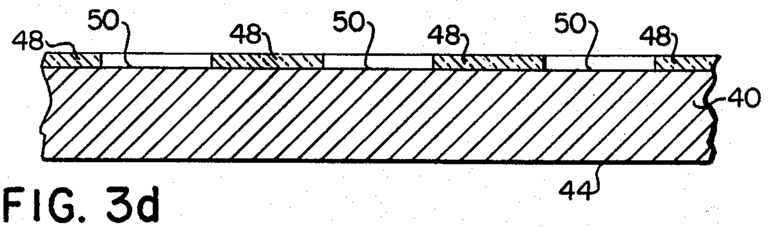
Figure 3F:
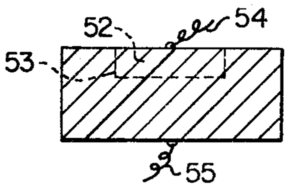
Figure 3D:
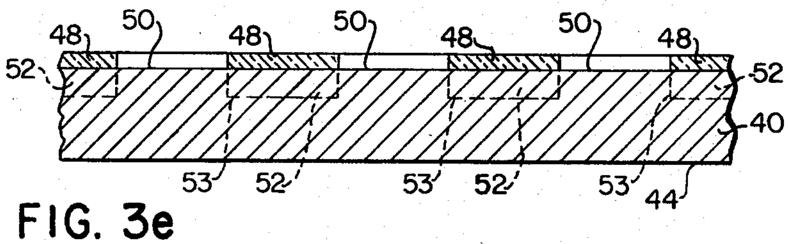
Figure 3E:
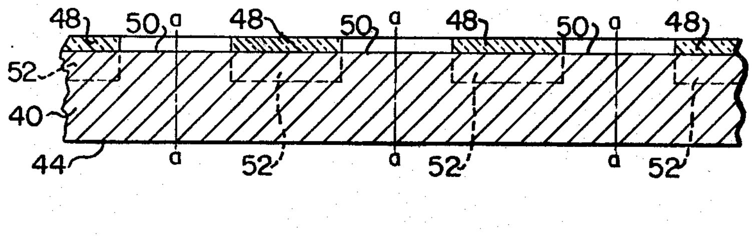

The wafer 40, covered with the boron-doped silicon dioxide region 48, as shown in FIG. 3*c*, is placed for two hours in a furnace having a nitrogen atmosphere and a temperature of 1,150 degrees centigrade, so that p-regions 52 with junctions 53 are formed in the silicon wafer 40, as shown in FIG. 3*d*. The regions 52 are separated by cutting along the lines *a—a*, as shown in FIG. 3*e*. An electrical lead 54 is attached to the p-region 52, and an electrical lead 55 is attached to the side 44 of the n-type silicon wafer 40, to form a junction diode, as shown in FIG. 3*f*.

What is claimed is:

1. A method of doping semiconductor material, comprising:

(a) spinning a semiconductor material having at least one hydrophilic surface at a high velocity;

(b) simultaneously depositing drops of a liquid mixture, comprising silicon dioxide particles and selected dopant atoms for said semiconductor material, onto a selected area, of a hydrophilic surface of the spinning semiconductor material, the selected area overlaying a region of said semiconductor material, which region has been selected for doping, each drop forming a doped silicon dioxide film within a doped stratified silicon dioxide layer formed on said selected area; and (c) heating said region of said semiconductor material in an inert gas atmosphere to a temperature sufficient to allow said atoms to diffuse from said doped stratified silicon dioxide layer into said region.

2. The method as claimed in claim 1 wherein the semiconductor material is selected from the group consisting of silicon, germanium, and germanium-silicon alloy.

3. The method as claimed in claim 2 wherein the dopant atoms are selected from the group consisting of boron atoms, phosphorus atoms, aluminum atoms, gallium atoms, indium atoms, arsenic atoms, and antimony atoms.

4. The method as claimed in claim 3 wherein the liquid mixture is an aqueous liquid mixture.

5. The method as claimed in claim 1 wherein the semiconductor material is selected from the group consisting of gallium arsenide, gallium phosphide, gallium antimonide, indium phosphide, indium arsenide, and indium antimonide.

6. The method as claimed in claim 5 wherein the dopant atoms are selected from the group consisting of zinc atoms, cadmium atoms, mercury atoms, silicon atoms, germanium atoms, tin atoms, and lead atoms.

7. The method as claimed in claim 5 wherein the doaent atoms are selected from the group consisting of sulfur atoms, selenium atoms, tellurium atoms, and polonium atoms.

8. The method as claimed in claim 5 wherein the liquid mixture is an aqueous liquid mixture.

9. A method of doping semiconductor material, comprising:

(a) spinning a semiconductor material having at least one hydrophilic surface at a high velocity;

(b) simultaneously depositing drops of a doped liquid dispersion, comprising a liquid, colloidal silicon dioxide particles suspended in said liquid, and a selected semiconductor dopant soluble in said liquid, the dopant being dissolved in said liquid, onto a selected area of a hydrophilic surface of the semiconductor material, the selected area overlaying a region of said semiconductor material, which region has been selected for doping, each drop forming a doped silicon dioxide film within a doped stratified silicon dioxide layer formed on said selected area; and (c) heating said region of said semiconductor material in an inert gas atmosphere to a temperature sufficient to allow the dopant atoms of said dopant to diffuse from said doped stratified silicon layer into said region.

10. A method of doping semiconductor material, comprising:

(a) spinning a semiconductor material having at least one hydrophilic surface at a high velocity;

(b) simultaneously depositing drops of a doped liquid dispersion, comprising a liquid, colloidal silicon dioxide particles suspended in said liquid, and a selected semiconductor dopant soluble in said liquid, the dopant being dissolved in said liquid, onto a selected area of a hydrophilic surface of the semiconductor material, the selected area overlaying a region of said semiconductor material, which region has been selected for doping, each drop forming a doped silicon dioxide film within a doped stratified silicon dioxide layer formed on said selected area;

(c) drying the deposition so that substantially all remaining liquid within the doped stratified silicon dioxide layer evaporates and the dopant and the silicon dioxide of the dispersion further coalesce on the selected area, forming a continuous stratified silicon dioxide doped layer on the selected area; and (d) heating said region of said semiconductor material in an inert gas atmosphere to a temperature sufficient to allow the dopant atoms of the layer to diffuse into said region.

11. The method as claimed in claim 10 wherein the liquid is water.

References Cited

UNITED STATES PATENTS

| | | | |
|---|---|---|---|
| 3,211,654 | 10/1965 | Jacob et al. | 252—62.3 |
| 3,212,929 | 10/1965 | Plisin et al. | 117—201 |
| 3,354,005 | 11/1967 | Lepiane et al. | 148—186 |

L. DEWAYNE RUTLEDGE, Primary Examiner

R. A. LESTER, Assistant Examiner

U.S. Cl. X.R.

117—201; 148—186; 252—62.3